United States Patent
Lee et al.

(10) Patent No.: US 7,037,835 B2
(45) Date of Patent: May 2, 2006

(54) INTERCONNECTIONS HAVING DOUBLE CAPPING LAYER AND METHOD FOR FORMING THE SAME

(75) Inventors: Kyoung-woo Lee, Seoul (KR); Soo-geun Lee, Suwon (KR); Ki-chul Park, Suwon (KR); Won-sang Song, Seoul (KR)

(73) Assignee: Samsung Elecrtonics, Co., Ltd., (KR)

( * ) Notice: Subject to any disclaimer, the term of this patent is extended or adjusted under 35 U.S.C. 154(b) by 25 days.

(21) Appl. No.: 10/744,277

(22) Filed: Dec. 23, 2003

(65) Prior Publication Data
US 2004/0135261 A1    Jul. 15, 2004

(30) Foreign Application Priority Data
Dec. 30, 2002  (KR) .................. 10-2002-0087245

(51) Int. Cl.
*H01L 21/44* (2006.01)
(52) U.S. Cl. ................. 438/682; 438/627; 438/631

(58) Field of Classification Search ............... 257/751, 257/758, 762, 763, 764, 775; 438/627, 631, 438/643, 645, 622, 118, 682–683, 685, 656
See application file for complete search history.

(56) References Cited

U.S. PATENT DOCUMENTS 6,465,888 B1 *  10/2002  Chooi et al. ............... 257/751
6,756,321 B1 *   6/2004  Ko et al. .................... 438/778

* cited by examiner

*Primary Examiner*—Roy Potter
(74) *Attorney, Agent, or Firm*—Mills & Onello LLP

(57) ABSTRACT

Provided are an interconnection of a semiconductor device which includes a capping layer and a method for forming the interconnection. The interconnection of the semiconductor device is a copper damascene interconnection where the capping layer is formed as a dual layer of a silicon nitride layer and silicon carbide layer on a copper layer processed by chemical mechanical polishing (CMP). Therefore, it is possible to maintain a high etching selectivity and a low dielectric constant of the silicon carbide layer while providing superior leakage suppression.

17 Claims, 4 Drawing Sheets

INTERCONNECTIONS HAVING DOUBLE CAPPING LAYER AND METHOD FOR FORMING THE SAME

CROSS REFERENCE TO RELATED APPLICATION

This application claims priority under 35 U.S.C. §119 from Korean Patent Application No. 2002-87245, filed on 30 Dec. 2002, the contents of which are hereby incorporated by reference in their entirety as if fully set forth therein.

BACKGROUND OF THE INVENTION

1. Field of the Invention

The present invention relates to an interconnection such as a line and/or a via in a semiconductor device and a method for forming the interconnection, and more particularly, to a single or dual damascene interconnection which is formed in a low dielectric constant layer and coated with a capping layer and a method for forming the same.

2. Description of the Related Art

In order to obtain high-speed semiconductor devices, it is necessary to reduce the thickness of a gate oxide layer and the length of a gate. However, RC (resistance capacitance) delay that is proportion to the resistance of an interconnection and the capacitance of an interlayer insulating film has a negative influence on the speeds of semiconductor devices. Thus, various attempts have been made to reduce the RC delay by using a low resistance interconnection and a low dielectric constant interlayer insulating film.

Conventionally, aluminum (Al) was widely used as an interconnection material. However, recently, copper (Cu) has been gradually considered to be more useful for integrated circuits. The resistivity of copper (Cu) is half the resistivity of aluminum (Al), and thus it is possible to increase the speed of signal transmission with copper (Cu) of a small width. Besides, since copper (Cu) has a high resistance to electro-migration, the reliability of semiconductor devices can be improved. Moreover, copper (Cu) shows low power consumption and is cheaper than aluminum (Al).

One drawback to using copper (Cu), however, is that copper (Cu) is difficult to etch and pattern after a desired interconnection. Therefore, copper interconnections are formed by a damascene process. The damascene process comprises the following general steps. An opening in a shape of the desired interconnection is formed in an interlayer insulating film. Then, a planarization process is performed after a copper layer is formed to fill the opening. Generally, chemical mechanical polishing (CMP) is used as the planarization process. In particular, a dual damascene process is used to form the copper (Cu) interconnections. The dual damascene process comprises the following steps. A via trench and a wiring trench are formed such that the wiring trench overlaps with an upper portion of the via trench. Then, the planarization process is performed after a copper layer is formed to fill both the via trench and the wiring trench. As already known to those skilled in this field, the copper layer must be formed twice to separately form a via and a wiring line. Each process for forming the via and the wiring line is referred to as a single damascene process.

FIG. 1 is a cross-sectional diagram illustrating a conventional single damascene interconnection. Referring to FIG. 1, a damascene interconnection 7 fills an opening 3 in an interlayer insulating film 1 and is surrounded by a barrier metal layer 5. A capping layer 9 such as a silicon nitride layer covers the interlayer insulating film 1 and the damascene interconnection 7. The capping layer 9 is deposited on the damascene interconnection 7 after CMP is performed during the damascene process. The capping layer 9 should effectively prevent copper (Cu) from diffusing into the interlayer insulating film 1 and has a high etching selectivity to other interlayer insulating films to be formed on the damascene interconnection 7. Since a material of a low dielectric constant, e.g., 2–4, is recently used as an interlayer insulating film, the need for a substitute for silicon nitride becomes apparent. Actually, silicon nitride has been typically used as a capping layer, but it has a high dielectric constant, e.g., 6–8, and a low etching selectivity to a low dielectric constant layer. Silicon carbide has a low dielectric constant, e.g., 4–5, and a high etching selectivity to the low dielectric constant layer. Therefore, silicon carbide is an appropriate substitute for silicon nitride as the capping layer. However, if silicon carbide is used as the capping layer, leakages in the interface between planarized interlayer insulating film and the capping layer become more difficult to suppress.

SUMMARY OF THE INVENTION

The present invention provides an interconnection of a semiconductor device in which the characteristics of a capping layer are improved such that the capping layer has a high etching selectivity to a low dielectric constant layer and shows an improved leakage suppression.

The present invention also provides a method for forming the interconnection of the semiconductor device.

There are provided a dual capping layer of a damascene interconnection which is formed of silicon nitride and silicon carbide, an interconnection of a semiconductor device which includes the capping layer, and a method for forming the interconnection.

According to an aspect of the present invention, there is provided an interconnection of a semiconductor device. The interconnection comprises an interlayer insulating film, a barrier metal layer, a metal layer, and a capping layer. The interlayer insulating film has an opening therein in the shape of the interconnection. The barrier metal layer is formed along the inner wall of the opening. The metal layer fills the opening over the barrier metal layer and has a top surface level with a top surface of the interlayer insulating film. The capping layer coats the top surfaces of interlayer insulating film and metal layer and is a dual layer formed by sequentially depositing a silicon nitride layer and a silicon carbide layer.

According to another aspect of the present invention, there is provided a method of forming an interconnection of a semiconductor device. The method includes (a) forming an interlayer insulating film on a substrate; (b) forming an opening in the shape of the interconnection by etching the interlayer insulating film; (c) forming a barrier metal layer on the resultant structure of step (b); (d) filling the opening by forming a metal layer on the barrier metal layer; (e) planarizing the resultant structure of step (d) until the interlayer insulating film is exposed; and (f) forming a capping layer by sequentially depositing a silicon nitride layer and a silicon carbide layer on the resultant structure of step (e).

As described above, the dual capping layer formed by sequentially depositing silicon nitride and silicon carbide can have a high etching selectivity to an interlayer insulating film when the interlayer insulating film is deposited on the dual capping layer and etched to form another interconnection on the dual capping layer. Also, it is possible to improve leakage suppression in the interface between the interlayer insulating film and the dual capping layer.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

FIGS. 2 through 5 are cross-sectional diagrams illustrating an interconnection and a method for forming the interconnection according to an embodiment of the present invention. The following descriptions mainly relate to a copper interconnection but may also be applied to all low resistance conductive materials such as aluminium (Al), silver (Ag), gold (Au), copper (Cu), and alloys thereof.

Figure 2:
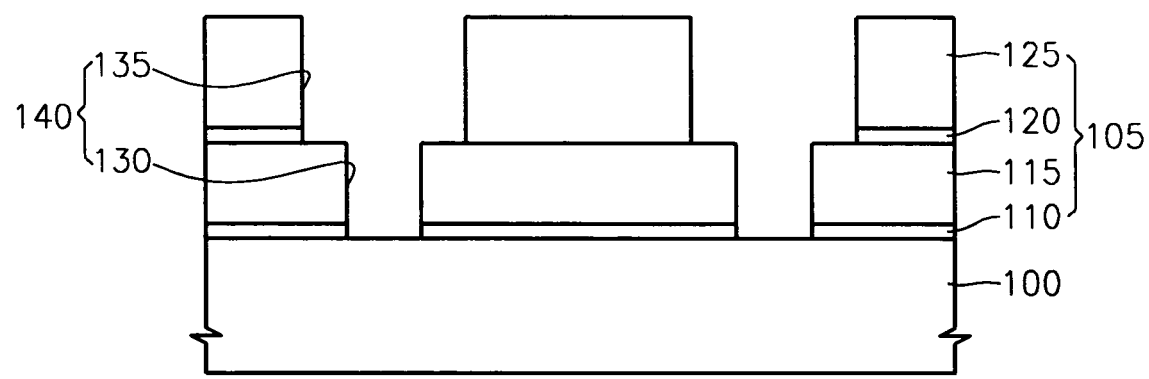
FIGS. 2 through 5 are cross-sectional diagrams illustrating an interconnection and a method for forming the interconnection according to an embodiment of the present invention.

Referring to FIG. 2, an interlayer insulating film 105 is formed on a substrate 100. An insulating layer or a conductive layer such as doped silicon, tungsten (W), aluminium (Al), or copper (Cu) may be interposed between the substrate 100 and the interlayer insulating film 105. The interlayer insulating film 105 is composed of a stack of insulating films 110, 115, 120, and 125. The insulating films 115 and 125 are oxide films used to form openings in the shape of a desired interconnection and are formed of low dielectric constant materials to reduce RC (resistance and capacitance) delay. For example, the low dielectric constant materials may be black diamond, fluorine silicate glass (FSG), SiOC, polyimides, or SiLK™. The insulating films 110 and 120 are formed of silicon carbide and are used as an etching stopper when the insulating films 115 and 125 are etched to form the openings.

An opening 140 is formed in the shape of the desired interconnection by etching a part of the interlayer insulating film 105. The opening 140 of FIG. 2 is used for a dual damascene interconnection where a wiring trench 135 is formed on a via trench 130. After the via trench 130 is formed by sequentially etching the insulating films 125, 120, 115, and 110, the wiring trench 135 is formed by etching the insulating films 125 and 120 such that the wiring trench 135 overlaps with the via trench 130. Alternatively, the wiring trench 135 may be formed before the via trench 130 is formed.

Figure 3:
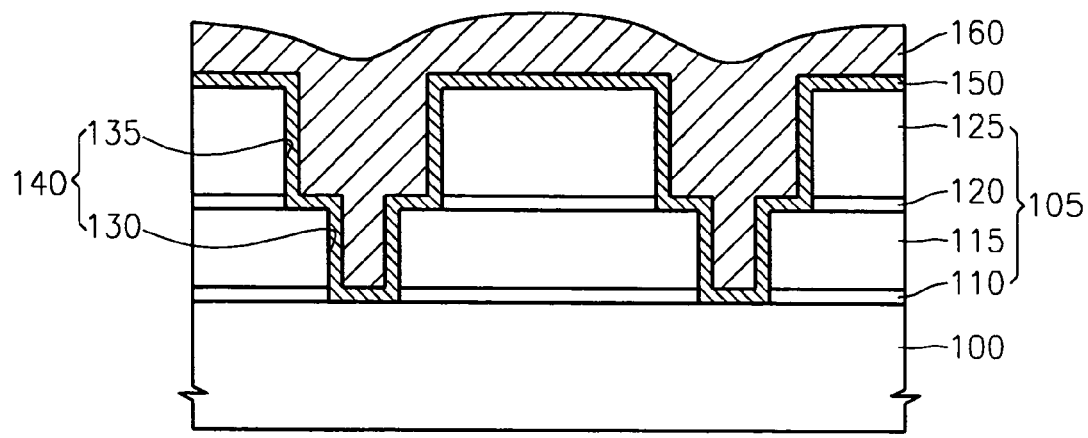

Referring to FIG. 3, after the resultant structure having the opening 140 is cleaned, a barrier metal layer 150 is formed on the resultant structure. The barrier metal layer 150 prevents metal atoms of a material used to fill the opening 140 from diffusing into the interlayer insulating film 105. The thickness of the barrier metal layer 150 is 200–1000 Å, preferably, 450 Å. The barrier metal layer 150 may be titanium (Ti), tantalum (Ta), tungsten (W), or nitrides thereof. For example, the barrier metal layer 150 may be TiN, TaN, WN, TaSiN, WSiN, or TiSiN. The barrier metal layer 150 may be deposited by chemical vapor deposition (CVD) or physical vapor deposition (PVD) such as sputtering.

The opening 140 is filled with a metal layer 160 formed of copper or copper alloys. The copper alloys are formed by intentionally or unintentionally mixing copper with a small amount of C, Ag, Co, Ta, In, Sn, Zn, Mn, Ti, Mg, Cr, Ge, Sr, Pt, Mg, Al, or Zr. Typically, the opening 140 is filled with copper by using sputtering or CVD, but it can be filled with copper by using plating including electro plating and electroless plating. When plating is used, it is desirable to form a seed metal layer (not shown) on the barrier metal layer 150 before the plating starts. The seed metal layer increases the uniformity of the plated metal layer 160 and is used as an initial nucleation site. The thickness of the seed metal layer may be 500–2500 Å, preferably, 1500 Å. The seed metal layer is deposited typically by sputtering, but sometimes, can be deposited by using CVD. Sputtering is performed under the conditions of a substrate 100 temperature of 0° C., a sputter power of 2 kW, a pressure of 2 mTorr, and a distance from a target to the substrate 100 of 60 mm. The seed metal layer may be formed of copper (Cu), gold (Au), silver (Ag), platinum (Pt), or palladium (Pd) according to the kind of metal layer to be plated and the kind of plating. Since a copper layer, which has just been plated, is formed of very small grains with low packing density, an annealing process should be applied to the copper layer to reduce its resistivity by using gain growth in recrystalization of the copper layer. The opening 140 may be filled with copper by using sputtering or CVD as well as plating. In addition, metals having a resistance appropriate for an interconnection such as gold, platinum, or silver may fill the opening 140. In order to assure a large enough margin for a subsequent CMP process, the copper layer should be deposited to a height that is 0.2 μm greater than the opening 140.

Figure 4:
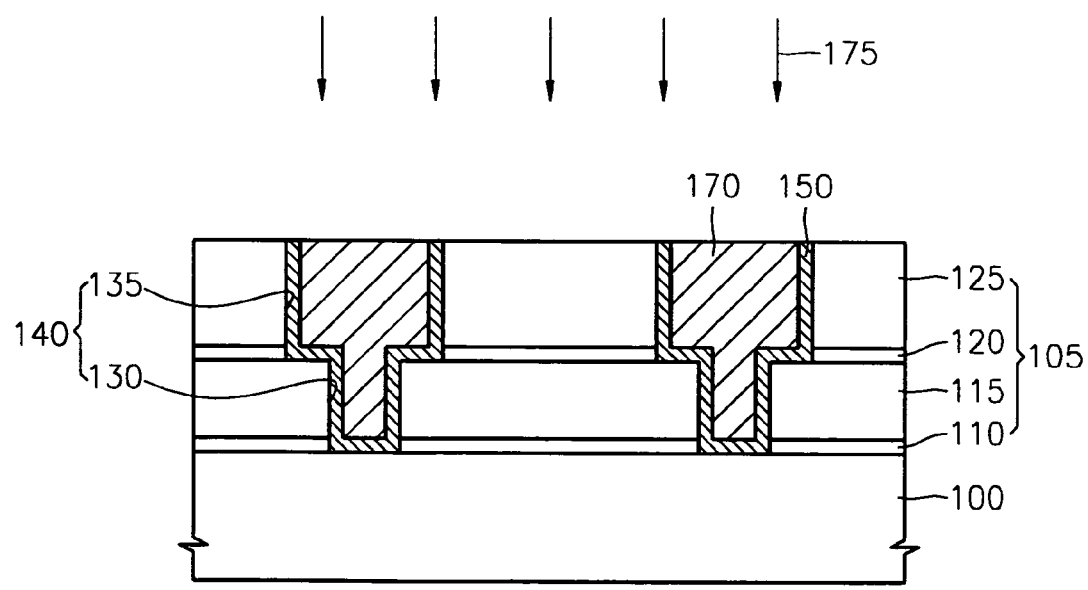

Referring to FIG. 4, the dual damascene interconnection 170 is formed by planarizing the resultant structure of FIG. 3 using CMP until the top surface of the insulating film 125 is exposed. It is difficult to completely block oxygen while forming the dual damascene interconnection 170. This is very true in a case where a reaction chamber is used. A slurry used for CMP usually includes oxygen. Thus, a thin copper oxide film such as a CuO or $Cu_2O$ film naturally forms on the surface of the copper layer. If the copper oxide film is not removed from the copper layer, the copper layer has weak adhesion to a film deposited thereon, which increases the resistance and degrades the reliability of semiconductor devices.

Therefore, the copper oxide film should be removed by deoxidization using a plasma process 175. Plasma may be generated by applying RF to a gas that includes Ar, He, and $H_2$, obtaining a kind of hydric plasma, or by applying RF to a gas that includes Ar, He, and $NH_3$, obtaining a kind of plasma including $NH_3$. If plasma including $NH_3$ is used for the plasma process 175, it is possible to nitrify a surface of the dual damascene interconnection 170 as well as deoxidize the surface of the dual damascene interconnection 170.

Figure 5:
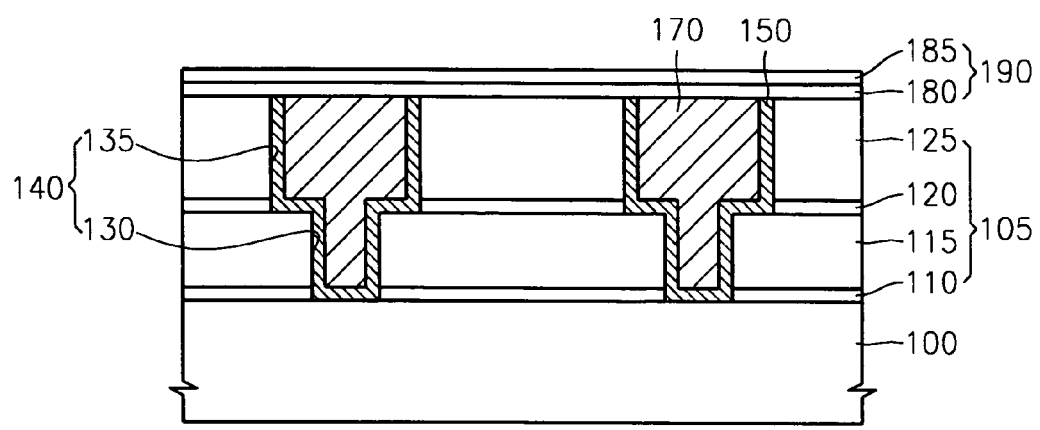

After that, as shown in FIG. 5, a silicon nitride layer 180 is deposited on the resultant structure of FIG. 4. A silicon carbide layer 185 is deposited on the silicon nitride layer 180. The silicon nitride layer 180 and the silicon carbide layer 185 may be formed by using CVD or PVD but is preferably plasma enhanced CVD (PECVD). The thickness of the two layers may be 10–1000 Å each. The silicon nitride 180 and the silicon carbide 185 may be formed in situ during the plasma process 175. Thus, it is possible to simplify a process of forming the dual damascene interconnection 170 and prevent the copper oxide film from being formed again. As described above, if a capping layer 190 is formed as a dual layer of the silicon nitride layer 180 and the silicon carbide layer 185, an interface between the interlayer insulating film and the silicon carbide layer, which are susceptible to leakages, are changed into an interface between the interlayer insulating film and the silicon nitride layer, but a part of the silicon carbide layer having an etching selectivity to other materials remains. Thus, it is possible to satisfy both aspects of high etching selectivity and leakage suppression.

As shown in FIG. 5, the dual damascene interconnection 170 according to the present invention includes the interlayer insulating film 105 which has the opening 140 in the shape of the dual damascene interconnection 170 therein; the barrier metal layer 150 in the inner wall of the opening 140; the dual damascene interconnection 170 which fills the opening 140 over the barrier metal layer 150 and has a top surface level with a top surface of the interlayer insulating film 105; and the capping layer 190 which coats the top surfaces of the interlayer insulating film 105 and the dual damascene interconnection 170 and is formed as a dual layer of the silicon nitride layer 180 and the silicon carbide layer 185.

Figure 6:
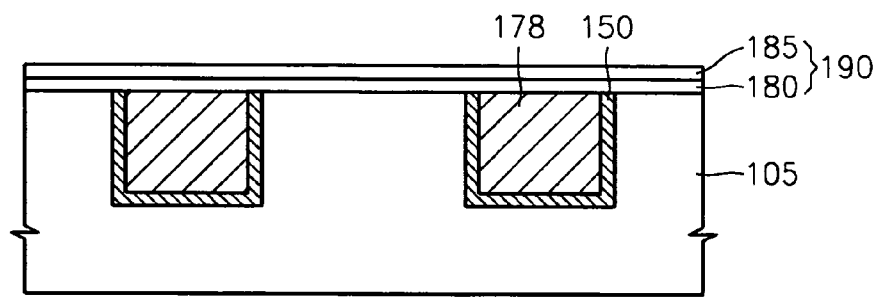
FIG. 6 is a cross-sectional diagram illustrating an interconnection and a method for forming the interconnection according to another embodiment of the present invention.

In this embodiment, the opening 140 includes the via trench 130 and the wiring trench 135 overlapping with the via trench 130 thereon so as to form the dual damascene interconnection 170. However, the present invention can be applied to a single damascene interconnection in which a simple wiring trench or a via trench is formed. Thus, the present invention can be applied to a case where a single damascene interconnection 178 is formed as shown in FIG. 6. In this case, a capping layer 190 is formed as a dual layer of a silicon nitride layer 180 and a silicon carbide layer 185.

In a multi-level interconnection, a dual damascene process or a single damascene process is performed after another interlayer insulating film is deposited on the capping layer 190. Here, the capping layer 190 functions as the insulating film 110 and has a high etching selectivity to the insulating films 125 and 115, which may be low dielectric constant films. Thus, the dual damascene interconnection 170 or the single damascene interconnection 178 is not etched when low dielectric constant films are etched. In addition, the capping layer 190 can prevent copper from diffusing into the interlayer insulating films, which makes it possible to reduce leakages.

Figure 1:
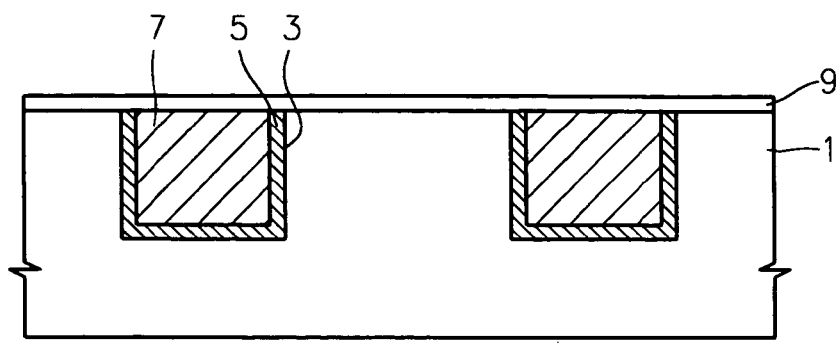
FIG. 1 is a cross-sectional diagram illustrating a conventional single damascene interconnection.

Leakages between two adjacent interconnections were estimated in each of the 16 samples of the single damascene interconnection shown in FIG. 1 according to prior art and the single damascene interconnection shown in FIG. 6 according to the present invention. The samples were prepared under the same conditions except for the capping layer 9 of FIG. 1 and the capping layer 190 of FIG. 6. The capping layer 9 according to prior art is formed as a single layer of silicon carbide. The capping layer 190 of the present invention is formed as a dual layer of the silicon nitride layer 180 and the silicon carbide layer 185. The analysis results show that an initial leakage current has decreased from about 300 nA of prior art to abut 10 nA of the present invention and thus the leakage current of the present invention has decreased to approximately ⅒ of the initial leakage current of the prior art.

Bias thermal stress (BTS) characteristics of two adjacent interconnections were analysed at 200° C. on 5 MV/cm range. When the BTS is applied to the single damascene interconnections of prior art, 5 samples of 16 samples have initial failures. However, in the present invention, there are no initial failures.

Figure 7:
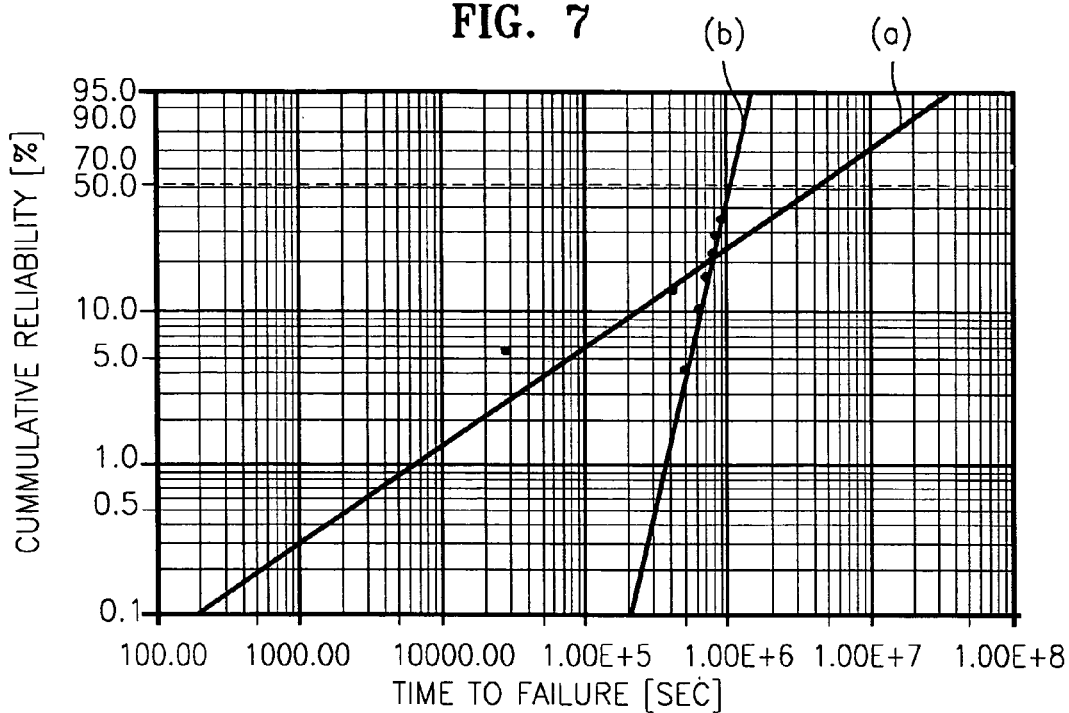
FIG. 7 is a graph showing experimental results of bias thermal stress (BTS) characteristics of a conventional interconnection and an interconnection according to the present invention.

Curves (a) and (b) of FIG. 7 indicate Weibull plots for prior art and the present invention, respectively, when the BTS characteristics were tested. As shown in FIG. 7, the time to failure is 1.3E6 seconds according to (a) and 1.0E6 seconds according to (b) when the cumulative reliability is 50%. Thus, the time to failure according to the present invention is decreased to approximately 80% of the time to failure according to prior art. However, according to the present invention, the shape factor is much more improved over that of prior art. Thus, it is determined that the present invention is more helpful for lifetime projection. Therefore, according to the present invention, a capping layer can have excellent leakage suppression as well as a high etching selectivity to a low dielectric constant layer. The excellent leakage suppression comes from an excellence in the adhesion of a silicon nitride layer to an interlayer insulating film.

Figure 8:
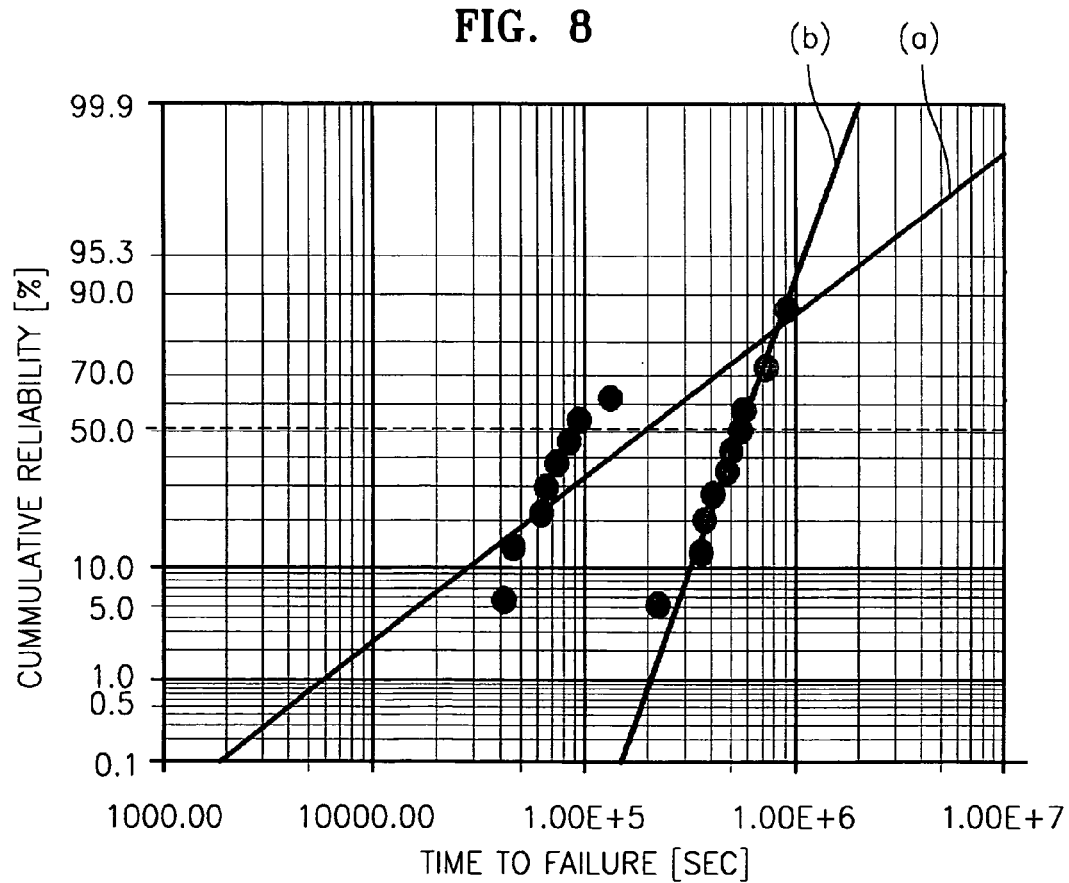
FIG. 8 is a graph showing experimental results of resistance to electro-migration of the conventional interconnection and the interconnection according to the present invention.

Curves (a) and (b) of FIG. 8 indicate Weibull plots for prior art and the present invention, respectively, when resistance to electro-migration is tested. As shown in FIG. 8, the time to failure is less than 100 seconds when the cumulative reliability is 50% according to (a), and the distribution of data point is very poor. However, the time to failure is more than 150 seconds according to (b), and the standard deviation σ thereof is 0.42, thus showing good distribution, under the same conditions as (a). Therefore, it is determined that the present invention shows more desirable results than prior art. In prior art, since an interfacial surface between a silicon carbide layer and a copper interconnection is not stable, voids occur in the interfacial surface and cause initial failures. However, according to the present invention, since the interfacial characteristics of the interfacial surface has been improved, voids do not occur in the interfacial surface.

As described above, a capping layer formed as a dual layer of a silicon nitride layer and a silicon carbide layer is used for a damascene interconnection which is processed by CMP. The silicon nitride layer has good adhesion to an interlayer insulating film, which provides superior leakage suppression. The silicon nitride layer has a relatively high dielectric constant, i.e., 6–8, but it can be combined with silicon carbide having a dielectric constant of 4–5. Thus, the dielectric constant of the capping layer can be reduced. In addition, the silicon carbide allows the capping layer to have a high etching selectivity to other interlayer insulating films deposited thereon.

While the present invention has been particularly shown and described with reference to exemplary embodiments thereof, it will be understood by those of ordinary skill in the art that various changes in form and details may be made therein without departing from the spirit and scope of thereof as defined by the appended claims.

What is claimed is:

1. A method of forming an interconnection of a semiconductor device, the method comprising:

(a) forming an interlayer insulating film on a substrate;

(b) forming an opening in the shape of the interconnection by etching the interlayer insulating film;.
(c) forming a barrier metal layer on the resultant structure of step (b);
(d) filling the opening by forming a metal layer on the barrier metal layer;
(e) planarizing the resultant structure of step (d) until the interlayer insulating film is exposed; and
(f) forming a capping layer by sequentially depositing a silicon nitride layer and a silicon carbide layer on the resultant structure of step (e).

2. The method of claim 1, wherein the method further comprises applying a plasma process to the surface of the resultant structure of step (e), between steps (e) and (f).

3. The method of claim 2, wherein the plasma process uses hydric plasma so as to deoxidize the metal layer.

4. The method of claim 2, wherein the plasma process uses plasma including $NH_3$ so as to deoxidize the metal layer and nitrify the surface of the metal layer.

5. The method of claim 1, wherein the metal layer is formed by applying chemical mechanical deposition (CVD), sputtering, or plating to copper or alloys of copper.

6. The method of claim 1, wherein the silicon nitride layer is formed by using plasma enhanced chemical mechanical deposition (PECVD) and has a thickness of 10–1000Å.

7. The method of claim 1, wherein the silicon carbide layer is formed by using PECVD and has a thickness of 10–1000Å.

8. The method of claim 1, wherein the opening is formed of one of a via trench and a wiring trench.

9. The method of claim 1, wherein the opening is formed of a via trench and a wiring trench overlapping with the via trench thereon.

10. The method of claim 1, wherein the method further comprises applying a plasma process to the surface of the resultant structure of step (e), between steps (e) and (f), by using plasma including $NH_3$ so as to deoxidize the metal layer and nitrify the surface of the metal layer, wherein applying the plasma process is performed in situ in step (f).

11. A method of forming an interconnection of a semiconductor device, the method comprising:
(a) forming an interlayer insulating film on a substrate;
(b) forming an opening in the shape of the interconnection by etching the interlayer insulating film;
(c) forming a barrier metal layer on the resultant structure of step (b);
(d) filling the opening by forming a metal layer on the barrier metal layer;
(e) planarizing the resultant structure of step (d) until the interlayer insulating film is exposed;
(f) applying a plasma process to the surface of the resultant structure of step (e); and
(g) forming a capping layer by sequentially depositing a silicon nitride layer and a silicon carbide layer on the resultant structure of step (e).

12. The method of claim 11, wherein the plasma process uses hydric plasma so as to deoxidize the metal layer.

13. The method of claim 11, wherein the plasma process uses plasma including $NH_3$ so as to deoxidize the metal layer and nitrify the surface of the metal layer.

14. A method of forming an interconnection of a semiconductor device, the method comprising:
(a) forming an interlayer insulating film on a substrate;
(b) forming an opening in the shape of the interconnection by etching the interlayer insulating film;
(c) forming a barrier metal layer on the resultant structure of step (b);
(d) filling the opening by forming a metal layer on the barrier metal layer;
(e) planarizing the resultant structure of step (d) until the interlayer insulating film is exposed; and
(f) forming a capping layer by sequentially depositing a silicon nitride layer and a silicon carbide layer on the resultant structure of step (e), wherein the silicon nitride layer is formed by using plasma enhanced chemical mechanical deposition (PECVD) and has a thickness of 10–1000Å.

15. A method of forming an interconnection of a semiconductor device, the method comprising:
(a) forming an interlayer insulating film on a substrate;
(b) forming an opening in the shape of the interconnection by etching the interlayer insulating film;
(c) forming a barrier metal layer on the resultant structure of step (b);
(d) filling the opening by forming a metal layer on the barrier metal layer;
(e) planarizing the resultant structure of step (d) until the interlayer insulating film is exposed; and
(f) forming a capping layer by sequentially depositing a silicon nitride layer and a silicon carbide layer on the resultant structure of step (e), wherein the silicon carbide layer is formed by using PECVD and has a thickness of 10–1000Å.

16. A method of forming an interconnection of a semiconductor device, the method comprising:
(a) forming an interlayer insulating film on a substrate;
(b) forming an opening in the shape of the interconnection by etching the interlayer insulating film, wherein the opening is formed of a via trench and a wiring trench overlapping with the via trench thereon;
(c) forming a barrier metal layer on the resultant structure of step (b);
(d) filling the opening by forming a metal layer on the barrier metal layer;
(e) planarizing the resultant structure of step (d) until the interlayer insulating film is exposed; and
(f) forming a capping layer by sequentially depositing a silicon nitride layer and a silicon carbide layer on the resultant structure of step (e).

17. A method of forming an interconnection of a semiconductor device, the method comprising:
(a) forming an interlayer insulating film on a substrate;
(b) forming an opening in the shape of the interconnection by etching the interlayer insulating film;
(c) forming a barrier metal layer on the resultant structure of step (b);
(d) filling the opening by forming a metal layer on the barrier metal layer;
(e) planarizing the resultant structure of step (d) until the interlayer insulating film is exposed; and
(f) forming a capping layer by sequentially depositing a silicon nitride layer and a silicon carbide layer on the resultant structure of step (e);
wherein the method further comprises applying a plasma process to the surface of the resultant structure of step (e), between steps (e) and (f), by using plasma including $NH_3$ so as to deoxidize the metal layer and nitrify the surface of the metal layer, wherein applying the plasma process is performed in situ in step (f).

* * * * *

UNITED STATES PATENT AND TRADEMARK OFFICE
CERTIFICATE OF CORRECTION

| | |
|---|---|
| PATENT NO. | : 7,037,835 B2 |
| APPLICATION NO. | : 10/744277 |
| DATED | : May 2, 2006 |
| INVENTOR(S) | : Kyoung-woo Lee et al. |

Page 1 of 1

It is certified that error appears in the above-identified patent and that said Letters Patent is hereby corrected as shown below:

Column 7, line 2 claim 1, delete ".".

Column 7, line 21 claim 5, replace "mechanical" with --vapor--.

Column 7, line 24 claim 6, replace "mechanical" with --vapor--.

Column 8, line 9 claim 14, replace "mechanical" with --vapor--.

Signed and Sealed this

Nineteenth Day of February, 2008

JON W. DUDAS
*Director of the United States Patent and Trademark Office*